(12) United States Patent
Yamashita et al.

(10) Patent No.: US 10,256,339 B2
(45) Date of Patent: Apr. 9, 2019

(54) SEMICONDUCTOR DEVICE FOR POWER TRANSISTOR

(71) Applicant: RENESAS ELECTRONICS CORPORATION, Tokyo (JP)

(72) Inventors: Yasunori Yamashita, Ibaraki (JP); Koichi Arai, Ibaraki (JP); Kenichi Hisada, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/137,279

(22) Filed: Sep. 20, 2018

(65) Prior Publication Data

US 2019/0027597 A1 Jan. 24, 2019

Related U.S. Application Data

(62) Division of application No. 15/627,333, filed on Jun. 19, 2017, now Pat. No. 10,109,733.

(30) Foreign Application Priority Data

Jun. 23, 2016 (JP) ................................ 2016-124326

(51) Int. Cl.
*H01L 21/02* (2006.01)
*H01L 29/78* (2006.01)
(Continued)

(52) U.S. Cl.
CPC .... *H01L 29/7813* (2013.01); *H01L 21/02164* (2013.01); *H01L 21/02236* (2013.01); *H01L 21/02271* (2013.01); *H01L 21/02529* (2013.01); *H01L 21/31111* (2013.01); *H01L 29/0696* (2013.01); *H01L 29/0865* (2013.01);
(Continued)

(58) Field of Classification Search
CPC ............ H01L 29/7813; H01L 29/1095; H01L 29/66734; H01L 21/02271; H01L 21/02529; H01L 21/31111; H01L 29/0696; H01L 29/0865; H01L 29/1033; H01L 21/02164; H01L 29/1608; H01L 29/4236; H01L 29/42368; H01L 29/45; H01L 29/513; H01L 29/66068; H01L 21/02236; H01L 21/02255
See application file for complete search history.

(56) References Cited

U.S. PATENT DOCUMENTS

2012/0261714 A1* 10/2012 Taketani ........... H01L 21/28211
257/139
2015/0295079 A1* 10/2015 Nakano ................. H01L 29/401
257/330

FOREIGN PATENT DOCUMENTS

JP 2013-232533 A 11/2013

OTHER PUBLICATIONS

Non-Final Office Action issued in related parent U.S. Appl. No. 15/627,333, dated Feb. 8, 2018.
(Continued)

*Primary Examiner* — Selim U Ahmed
(74) *Attorney, Agent, or Firm* — McDermott Will & Emery LLP

(57) ABSTRACT

In a semiconductor device, in a gate insulating film which is formed on/over an inner wall of a trench, the film thickness of a part of a gate insulating film formed so as to cover a corner of the trench is made thicker than the film thickness of apart of the gate insulating film part formed on/over a side face of the trench.

4 Claims, 12 Drawing Sheets

(51) Int. Cl.
  *H01L 29/66*  (2006.01)
  *H01L 21/311*  (2006.01)
  *H01L 29/06*  (2006.01)
  *H01L 29/08*  (2006.01)
  *H01L 29/10*  (2006.01)
  *H01L 29/16*  (2006.01)
  *H01L 29/423*  (2006.01)
  *H01L 29/45*  (2006.01)
  *H01L 29/51*  (2006.01)

(52) U.S. Cl.
  CPC ...... *H01L 29/1033* (2013.01); *H01L 29/1095* (2013.01); *H01L 29/1608* (2013.01); *H01L 29/4236* (2013.01); *H01L 29/42368* (2013.01); *H01L 29/45* (2013.01); *H01L 29/513* (2013.01); *H01L 29/66068* (2013.01); *H01L 29/66734* (2013.01); *H01L 21/02255* (2013.01)

(56) References Cited

OTHER PUBLICATIONS

Notice of Allowance issued in related parent U.S. Appl. No. 15/627,333, dated Jun. 29, 2018.

\* cited by examiner

SEMICONDUCTOR DEVICE FOR POWER TRANSISTOR

CROSS-REFERENCE TO RELATED APPLICATIONS

The application is a Divisional of U.S. patent application Ser. No. 15/627,333, filed on Jun. 19, 2017, which claims the benefit of Japanese Patent Application No. 2016-124326 filed on Jun. 23, 2016 including the specification, drawings and abstract is incorporated herein by reference in their entirety.

BACKGROUND

The present invention relates to a semiconductor device and a technology (a method) of manufacturing the semiconductor device and relates to, for example, a technology which is effectively applied to a trench gate type power transistor and a technology (a method) of manufacturing the trench gate type power transistor.

For example, a technology of forming an overhang-shaped side wall insulating film so as to cover an upper edge of a gate trench in an inactive region is described in Japanese Unexamined Patent Application Publication No. 2013-232533.

SUMMARY

In a power transistor which is one of power semiconductor devices, the power transistor of the type (in the following, described as a Si power transistor) using a silicon substrate (a Si substrate) has been mainly used so far. However, in a power transistor of the type (in the following, described as a SiC power transistor) using a silicon carbide substrate (in the following, described as a SiC substrate), high breakdown voltage and low loss are attained in comparison with the Si power transistor. This is because silicon carbide (SiC) is larger in band gap than silicon (Si) and therefore a breakdown voltage thereof is increased, and consequently the breakdown voltage is ensured even when a drift layer is thinned. That is, in the SiC power transistor, the breakdown voltage is ensured even when the drift layer is thinned and, in addition, an on-resistance of the SiC power transistor is reduced because the drift layer is thinned. Accordingly, it may be said that the SiC power transistor which has such characteristics is suited for application to a semiconductor product which is to be high breakdown voltage.

Regarding this point, for example, as a device structure of the SiC power transistor, a so-called trench gate type power transistor of the type that a gate electrode is formed in a trench via a gate insulating film is proposed. In the trench gate type SiC power transistor, an electric current flows in a thickness direction (a longitudinal direction) of a semiconductor chip and therefore the degree of integration is improved. Consequently, the on-resistance is reduced by the trench gate type SiC power transistor.

However, in the trench in which the gate electrode has been formed via the gate insulating film, when a gate voltage has been applied to the gate electrode, electric field concentration is more liable to occur on a corner part of the trench than on a side face of the trench. This is because the electric field concentration is more liable to occur on a right angle shape place (the corner part) than on a flat shape place (the side face). Consequently, a leakage current is generated from the corner part of the trench at a voltage which is lower than the original breakdown voltage of the gate insulating film which is set for the flat place such as the side face of the trench and, as a result, there is the possibility that the gate insulating film may be broken on the corner part of the trench at a voltage which is lower than a design value voltage. In particular, in the SiC power transistor, it is difficult to form the gate insulating film of a favorable film quality such as that of the Si power transistor and it is easy to make the above-mentioned point obvious as the matter on which there is room for improvement.

Other matters to be solved and novel features of the present invention will become apparent from the description of the present specification and the appended drawings.

According to one embodiment of the present invention, there is provided a semiconductor device that, in a gate insulating film which has been formed on/over an inner wall of a trench, the film thickness of apart of the gate insulating film part which has been formed on/over a corner part of the trench so as to cover the corner part is made thicker than the film thickness of a part of the gate insulating film which has been formed on/over the side face of the trench.

According to one embodiment of the present invention, it is possible to improve reliability of the semiconductor device.

DETAILED DESCRIPTION

Figure 1:
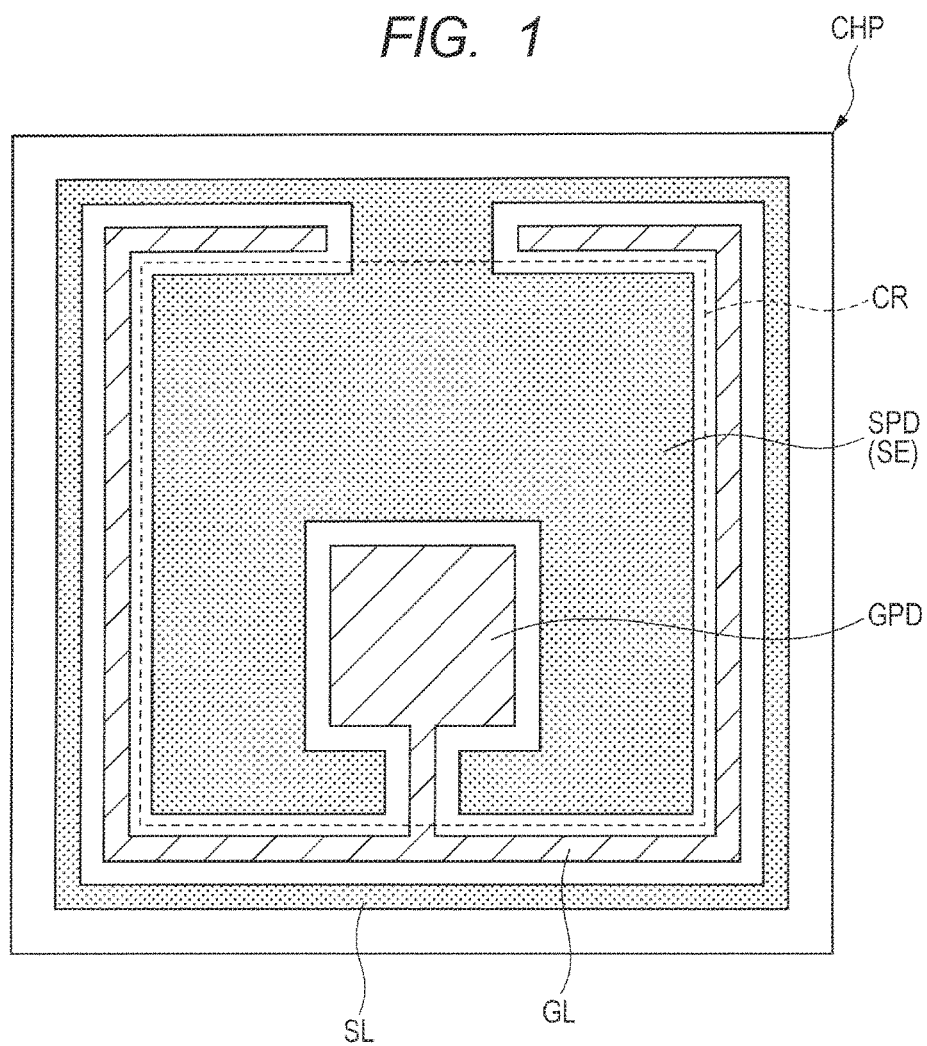
FIG. 1 is a plan view illustrating one example of a planar layout configuration of a semiconductor chip that a power transistor has been formed.

Although, in the following embodiments, description will be made by dividing into a plurality of sections or embodiments when division is requested for the convenience sake, these are not unrelated to each another and these are related to each other such that one covers some or all of altered examples, detailed explanation, supplemental explanation and so forth of the other unless otherwise clearly stated in particular.

In addition, in the following embodiments, in a case where a number of constitutional elements and so forth (a number of units, a numerical value, an amount/a quantity, a range and so forth are included) is referred to, it is not limited to the specific number and may be at least and/or not more than the specific number unless otherwise clearly stated in particular and unless otherwise definitely limited to the specific number in principle.

Further, in the following embodiments, it goes without saying that the constitutional elements (element steps and so forth are also included) thereof are not necessarily essential unless otherwise clearly stated in particular and unless otherwise thought to be clearly essential in principle.

Likewise, in the following embodiments, when the shapes of the constitutional elements and so forth, a positional relationship among them and so forth are referred to, the ones that are substantially approximate or similar to the shapes and so forth shall be included unless otherwise clearly stated in particular and unless otherwise clearly thought that they are not approximate or similar thereto in principle. The same is true of the above-mentioned numerical value and the range.

In addition, in all of the drawings illustrated in order to describe the embodiments, the same numerals are assigned to the same members in principle and repetitive description thereof is omitted. Incidentally, there are cases where hatching is added even in a plan view for easy illustration of the drawings.

<Description of Terms>

In the present specification, the term "electronic component" means a component which utilizes electrons and, in particular, a component which has utilized the electrons in a semiconductor is called a "semiconductor component". As one example of the "semiconductor component", a semiconductor chip may be given. Accordingly, the term which includes the "semiconductor chip" is the "semiconductor component" and a superordinate concept of the "semiconductor component" is the "electronic component".

In the present specification, the "semiconductor device" is a structure which includes the semiconductor component and an external coupling terminal which has been electrically coupled with the semiconductor component and means the structure that the semiconductor component is covered with, for example, a sealing body. In particular, the "semiconductor device" is configured to be electrically coupled with an external device by the external coupling terminal.

Further, in the present specification, the term "power transistor" means an assembly of unit transistors which realize a function of the unit transistor also with application of an electric current which is larger than an allowable electric current of the unit transistor by coupling the plurality of unit transistors (cell transistors) in parallel with one another (for example, coupling several thousands to hundreds of thousands of unit transistors in parallel with one another). For example, when the unit transistor functions as a switching element, the "power transistor" operates as a switching element which is applicable to the electric current which is larger than the allowable electric current of the unit transistor. In particular, in the present specification, the term "power transistor" is used as a word which indicates the superordinate concept which includes, for example, both of "power MOSFET" and "IGBT".

<Planar Layout Configuration of Semiconductor Chip>

FIG. 1 is a plan view illustrating one example of a planar layout configuration of a semiconductor chip CHP that a power transistor has been formed. As illustrated in FIG. 1, the semiconductor chip CHP has a rectangular shape and a cell region CR in which the power transistor has been formed is installed at the center of the semiconductor chip CHP. A source pad SPD which is a source electrode SE is formed on/over a surface of the cell region CR and a gate pad GPD is installed so as to be encapsulated in the source pad SPD separately from the source pad SPD. The gate pad GPD is coupled with a gate wiring line GL which extends so as to surround the cell region CR. Then, a source wiring line SL which has been coupled with the source pad SPD is installed outside the gate wiring line GL so as to surround the gate wiring line GL.

<Investigations of Improvement>

For example, a trench gate type power transistor is formed in the cell region CR of the above-mentioned semiconductor chip CHP. In the following, a sectional structure of the trench gate type power transistor in related art will be described and then matters that the inventors and others of the present invention have investigated so as to improve the related art power transistor will be described.

Incidentally, the "related art" described in the present specification is the art having the matters to be solved that the inventors and others of the present invention have newly found. Though not the well-known prior art, the related art is the art which has been described with the view to an underlying art/technology (a not yet known art/technology) of a novel technical idea.

Figure 2:
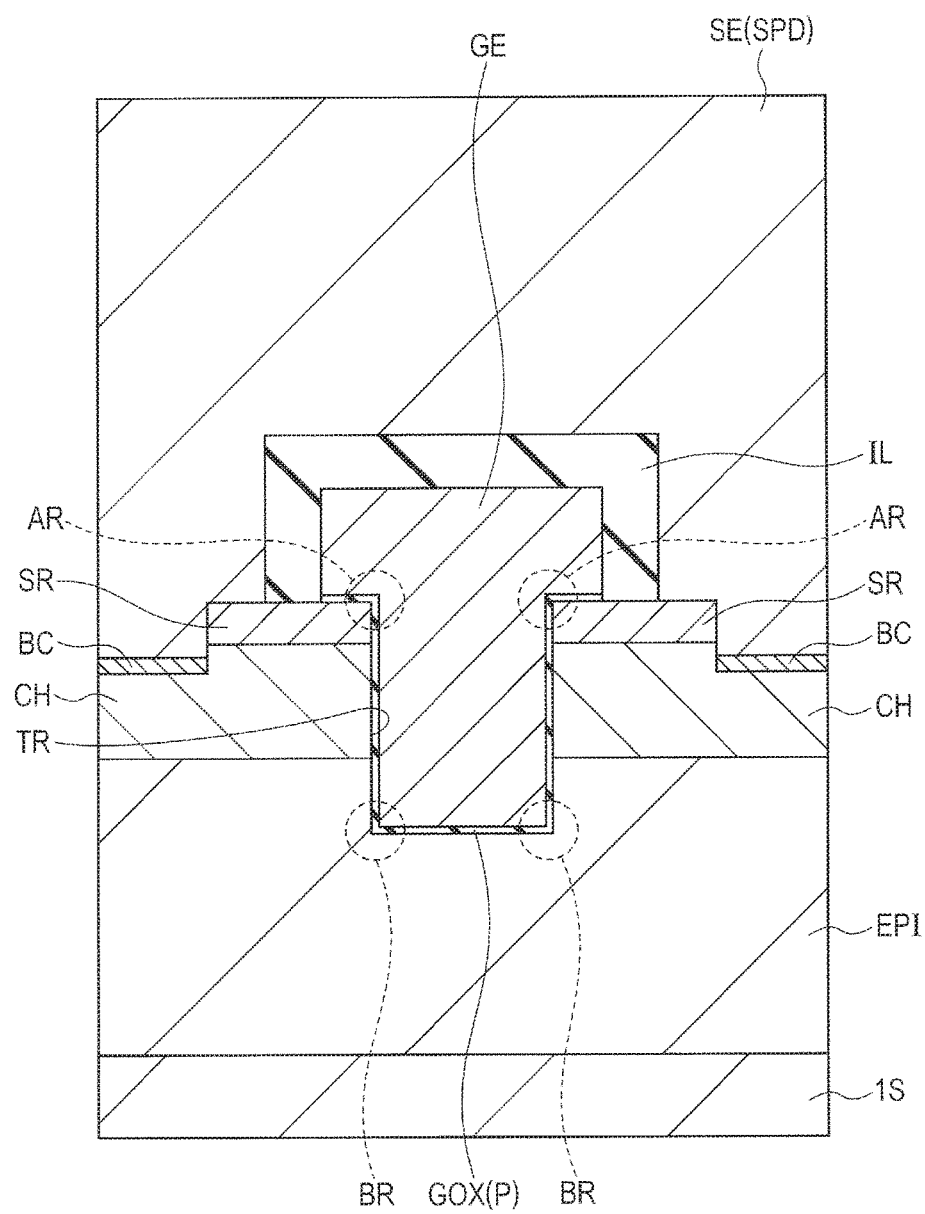
FIG. 2 is a sectional diagram illustrating one example of a sectional structure of a unit transistor which configures a trench gate type power transistor of related art.

FIG. 2 is a sectional diagram illustrating one example of a sectional structure of the unit transistor which configures the related art trench gate type power transistor. In FIG. 2, the related art trench gate type unit transistor has, for example, a drift layer (an epitaxial layer) EPI which is configured by an n-type semiconductor layer on/over a semiconductor substrate 1S which contains SiC and a channel layer CH which is configured by a p-type semiconductor layer is formed on/over the drift layer EPI. Then, a source region SR which is configured by an n-type semiconductor region is formed on/over a surface of the channel layer CH.

Here, a trench TR is formed so as to pass through the source region SR and the channel layer CH and reach the drift layer EPI. Then, a gate insulating film GOX(P) which is configured by, for example, a silicon oxide film is formed over a range from an inner wall of the trench TR to a part of an upper surface of the source region SR and a gate electrode GE is formed so as to be in contact with the gate insulating film GOX(P). As illustrated in FIG. 2, the gate electrode GE has a so-called "T-gate structure" that the gate electrode GE fills the inside of the trench TR and has a protrusion part which superposes on the part of the upper surface of the source region SR.

Next, a groove which reaches the channel layer CH is formed in the other end part on the opposite side of one end part of the source region SR which is in contact with the trench TR and a body contact region BC is formed on/over the bottom of the groove. The body contact region BC is configured by a p-type semiconductor region of an impurity concentration which is higher than the impurity concentration of the channel layer CH.

As illustrated in FIG. 2, an interlayer insulating film IL which is configured by, for example, a silicon oxide film is formed so as to cover the protrusion part of the gate electrode GE. Then, a source electrode SE which covers the interlayer insulating film IL and is in contact with the source region SR and the body contact region BC is formed. Consequently, the source region SR and the body contact region BC are electrically coupled together by the source electrode SE. The body contact region BC has a function of ensuring an ohmic contact between the source electrode SE and the channel layer CH and the source electrode SE and the channel layer CH are electrically coupled together via the body contact region BC.

Accordingly, the same potential is supplied to the source region SR and the channel layer CH and thereby an ON-operation of a parasitic bipolar transistor which is configured by the source region SR which is the n-type semiconductor region, the channel layer CH which is the p-type semiconductor layer and the drift layer EPI which is the n-type semiconductor layer is suppressed. This is because that the source region SR and the channel layer CH are electrically coupled together at the same potential means that a potential difference does not occur between the base and the emitter of the parasitic bipolar transistor and thereby the ON-operation of the parasitic bipolar transistor is suppressed.

Although the related art trench gate type unit transistor is configured as described above, according to the investigations made by the inventors and others of the present invention, there exists room for improvements which will be described below in related art.

Specifically, in FIG. 2, the electric field concentration is liable to occur on a corner part of the trench TR which is illustrated as a region AR when a gate voltage has been applied to the gate electrode GE. Likewise, the electric field concentration is liable to occur also on a corner part of the trench TR which is illustrated as a region BR when the gate voltage has been applied to the gate electrode GE. Consequently, when the film thickness of the gate insulating film GOX (P) is made uniform, the leakage current is generated from the corner part of the trench TR at the voltage which is lower than the original breakdown voltage of the gate insulating film which is set for the flat place such as the side face of the trench TR and therefore there is the possibility that the gate insulating film may be broken at the voltage which is lower than the design value voltage. That is, in related art, there exists room for improvement from the viewpoint of improving the reliability of the semiconductor device. Accordingly, in the present embodiment, the point which is present in related art and which has room for improvement is devised. In the following, the technical idea of the present embodiment on the basis of which the above-mentioned point has been devised will be described.

<Configuration of Semiconductor Device>

Figure 3:
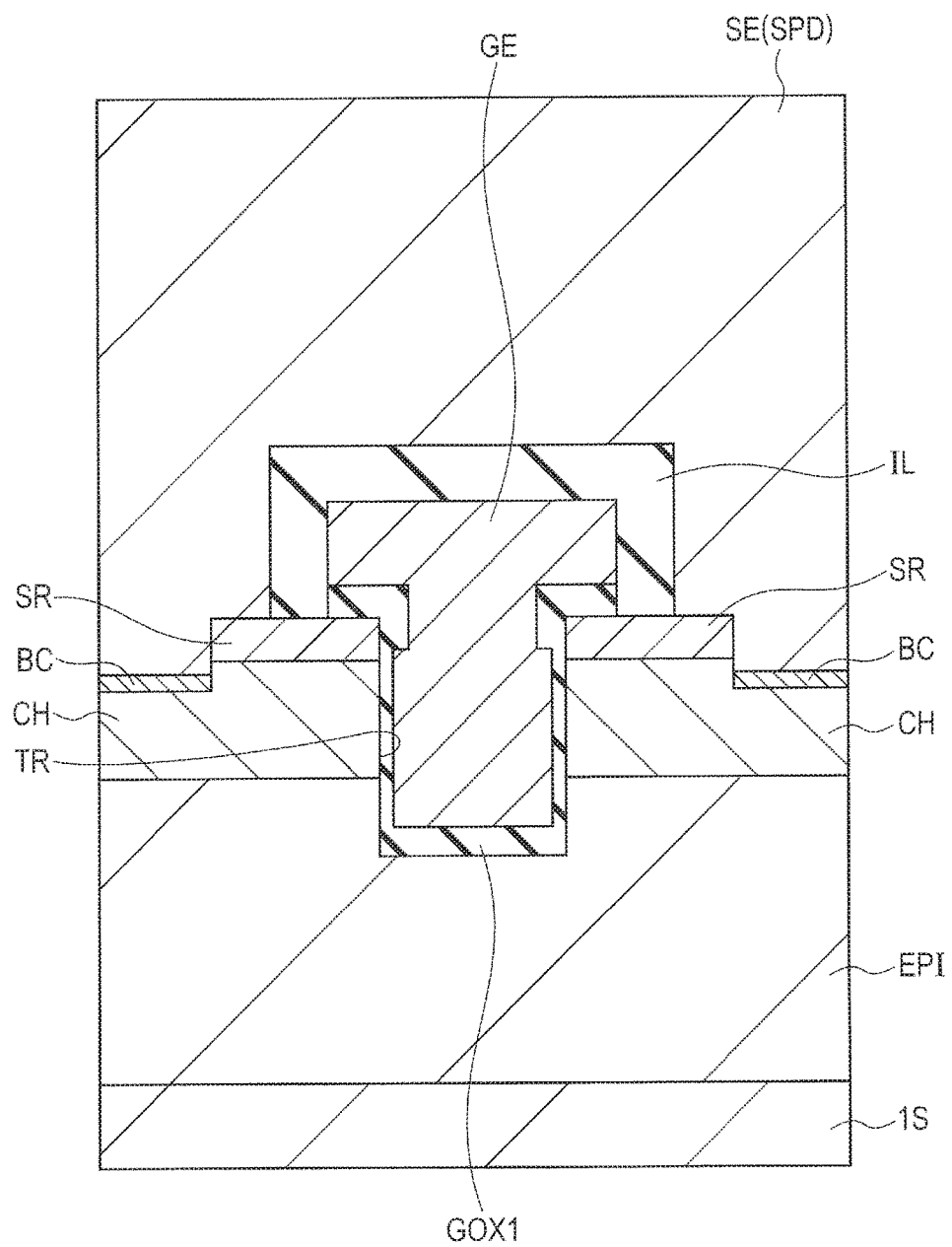
FIG. 3 is a sectional diagram illustrating one example of a sectional structure of a unit transistor according to one embodiment.

FIG. 3 is a sectional diagram illustrating one example of a sectional structure of a unit transistor according to the present embodiment. The unit transistor is formed in the cell region CR illustrated in FIG. 1. As illustrated in FIG. 3, the unit transistor according to the present embodiment includes, for example, the semiconductor substrate 1S which contains SiC and the drift layer ERI which is configured by the n-type semiconductor layer is formed on/over the semiconductor substrate 1S. In this case, the semiconductor substrate 1S and the drift layer EPI function as the drain region of the unit transistor (the power transistor). In particular, the drift layer EPI has a function of ensuring the breakdown voltage between the drain region and the later described source region SR. In the present embodiment, for example, the drift layer EPI is made of silicon carbide which is a wide band gap semiconductor which is larger in band gap than silicon. Here, since dielectric breakdown strength of SiC is greater than dielectric breakdown strength of Si (silicon), in the present embodiment, it is possible to make the thickness of the drift layer EPI used for ensuring the breakdown voltage thinner than that of the drift layer EPI when silicon is used and it is possible to make the impurity concentration of the drift layer EPI high. Consequently, it is possible to suppress an increase in on-resistance due to the presence of the drift layer EPI. That is, in the present embodiment, it is possible to simultaneously attain the breakdown voltage and a reduction in on-resistance by making the semiconductor substrate IS and the drift layer EPI of SiC.

Next, as illustrated in FIG. 3, the channel layer CH which is configured by the p-type semiconductor layer is formed on/over the drift layer EPI. The channel layer CH is a region adapted to form an inversion layer (an n-type semiconductor layer). Then, the source region SR which is configured by the n-type semiconductor region is formed on/over the surface of the channel layer CH. Then, the trench TR which passes through the source region SR and the channel layer CH and reaches the drift layer EPI is formed and a gate insulating film GOX1 which is configured by, for example, a silicon oxide film is formed over the range from the inner wall of the trench TR to the part of the upper surface of the source region SR. Then, the gate electrode GE which is configured by, for example, a polysilicon film is formed so as to fill the trench TR via the gate insulating film GOX1 and further the gate electrode GE has a protrusion part which protrudes from the trench TR and is arranged over the part of the surface of the source region SR. Accordingly, also the gate electrode GE according to the present embodiment has the so-called "T-gate structure".

Further, as illustrated in FIG. 3, the other end part on the opposite side of one end part of the source region SR which is in contact with the trench TR is in contact with the groove which reaches the channel layer CH and the body contact region BC which is configured by the p-type semiconductor region which is higher in impurity concentration than the channel layer CH is formed on/over the bottom of the groove. Further, as illustrated in FIG. 3, the interlayer insulating film IL which is configured by, for example, a silicon oxide film is formed so as to cover the protrusion part of the gate electrode GE. Then, the source electrode SE which covers the interlayer insulating film IL and is in contact with the source region SR and the body contact region BC is formed. Consequently, the source region SR and the body contact region BC are electrically coupled together by the source electrode SE. The body contact region BC has a function of ensuring the ohmic contact between the source electrode SE and the channel layer CH and therefore the source electrode SE and the channel layer CH are electrically coupled together via the body contact region BC.

The trench gate type unit transistor so configured according to the present embodiment forms the inversion layer (the n-type semiconductor region) on/over the channel layer CH which is in contact with the side face of the trench TR by applying the gate voltage which is at least a threshold voltage to the gate electrode GE. Thereby, the source region SR and the drift layer EPI (the drain region) are electrically coupled together via the inversion layer and when the potential difference is present between the source region SR and the drain region, the electrons flow from the source region SR to the drift layer EPI passing through the inversion layer. In other words, the electric current flows from the drift layer EPI to the source region SR passing through the inversion layer. When the gate voltage which is at least the threshold voltage is applied to the gate electrode GE of the unit transistor in this way, the unit transistor is operated to an ON-state. On the other hand, when a voltage which is lower than the threshold voltage is applied to the gate electrode GE of the unit transistor, the inversion layer which has been formed on/over the channel layer CH disappears and the source region SR and the drift layer EPI become non-conductive. Consequently, the unit transistor is operated to an OFF-state. It is seen that it is possible to operate the unit transistor to the ON/OFF state by changing the level of the gate voltage to be applied to the gate electrode GE of the unit transistor in the above-mentioned way.

Here, the threshold voltage on the basis of which the inversion layer is formed is varied depending on the film thickness of the gate insulating film GOX1 which is formed on/over the side face of the trench TR. That is, the part of the gate insulating film GOX1 which is formed on/over the side face of the trench TR which faces the channel layer CH has the function of adjusting the threshold voltage and the threshold voltage is determined depending on the film thickness of the above-mentioned part of the gate insulating film GOX1. For this reason, the film thickness of the part of the gate insulating film GOX1 which is formed on/over the side face of the trench TR which faces the channel layer CH is determined depending on the threshold voltage on the basis of which the inversion layer is formed. The unit transistor according to the present embodiment is formed in the above-mentioned way.

<Characteristic of the Embodiment>

Next, the characteristic point of the present embodiment will be described. The characteristic point of the present embodiment lies in the point that the gate insulating film GOX1 is configured so as to have the parts which are different from one another in film thickness as illustrated in FIG. 3. Specifically, as illustrated in FIG. 3, in the gate insulating film GOX1, the film thickness of the part which covers one corner part of the trench TR which is in contact with the source region SR is made thicker than the film thickness of the part which is in contact with the channel layer CH and the film thickness of the part which covers another corner part of the trench TR which is in contact with the drift layer EPI is made thicker than the film thickness of the part which is in contact with the channel layer CH. Thereby, according to the present embodiment, it is possible to prevent the gate insulating film GOX1 from being broken on the corner parts of the trench TR where the electric field concentration is liable to occur. Thereby, it is possible to improve the reliability of the semiconductor device.

Here, it is also conceivable to make the overall film thickness of the gate insulating film GOX1 is made thick uniformly in order to prevent the gate insulating film GOX1 from being broken. However, in this case, also the film thickness of the part of the gate insulating film GOX1 which is formed on/over the side face of the trench TR which is in contact with the channel layer CH is also made thick. The film thickness of the part of the gate insulating film GOX1 which is formed on/over the side face of the trench TR which is in contact with the channel layer CH is determined from the view point of adjusting the threshold voltage on the basis of which the inversion layer is formed and therefore it is difficult to make the film thickness of the part concerned thick in disregard of adjustment of the threshold voltage.

On the other hand, when the film thickness of the part of the gate insulating film GOX1 which covers the corner part of the trench TR which is in contact with the source region SR and the film thickness of the part of the gate insulating film GOX1 which covers the corner part of the trench TR which is in contact with the drift layer EPI are determined in conformity to the film thickness of the part of the gate insulating film GOX1 which is formed on/over the side face of the trench TR, a reduction in dielectric breakdown voltage caused by the electric field concentration would be induced.

Accordingly, in the present embodiment, for example, as illustrated in FIG. 3, the film thickness of the part of the gate insulating film GOX1 which covers the corner part of the trench TR which is in contact with the source region SR and the film thickness of the part of the gate insulating film GOX1 which covers the corner part of the trench TR which is in contact with the drift layer ERI are respectively made thicker than the film thickness of the part of the gate insulating film GOX1 which is in contact with the channel layer CH. Consequently, according to the present embodiment, it is possible to effectively suppress breakage of the parts of the gate insulating film GOX1 which cover the corner parts of the trench TR while maintaining the threshold voltage on the basis of which the inversion layer is formed so as to be equal to the design value.

Further, the gate insulating film GOX1 according to the present embodiment has the parts which are thick in film thickness and cover the corner parts of the trench TR. This means that it is possible to increase a distance between the gate electrode GE and the source region SR and a distance between the gate electrode GE and the drift layer EPI and thereby it becomes possible to reduce a parasitic capacitance between the gate electrode GE and the source region SR and a parasitic capacitance between the gate electrode GE and the drain region (the drift layer EPI).

Therefore, according to the unit transistor in the present embodiment, it is possible to promote speeding-up of a switching operation (the ON/OFF switching operation) owing to the reduction in parasitic capacitance. From the above, according to the present embodiment, not only it is possible to promote improvement of the reliability of the semiconductor device, but also it is possible to promote improvement of performance of the semiconductor device.

The unit transistor according to the present embodiment is useful precisely because, in particular, the gate electrode GE has the so-called "T-gate structure" as illustrated in FIG. 3. The reason is that the "T-gate structure" has the protrusion part which has been formed so as to protrude from the trench TR and hang over the part of the upper surface of the source region SR and therefore the electric field concentration occurs not only on the bottom-side corner part of the channel TR but also on the upper-side corner part of the trench TR which is in contact with the source region SR. That is, in the "T-gate structure", the electric field concentration is liable to occur on all of the four corner parts that the trench TR has. For this reason, according to the characteristic point of the present embodiment that the parts of the gate insulating film GOX1 which respectively cover the four corner parts of the trench TR are made thick, it is possible to increase the film thicknesses of the parts of the gate insulating film GOX1 which are formed on/over all of the parts of the trench TR where the electric field concentration is liable to occur and, as a result, it is possible to obtain such a favorable advantageous effect that it is possible to effectively suppress breakage of the gate insulating film GOX1 which would occur at the low voltage in the unit transistor having the "T-gate structure".

Figure 4:
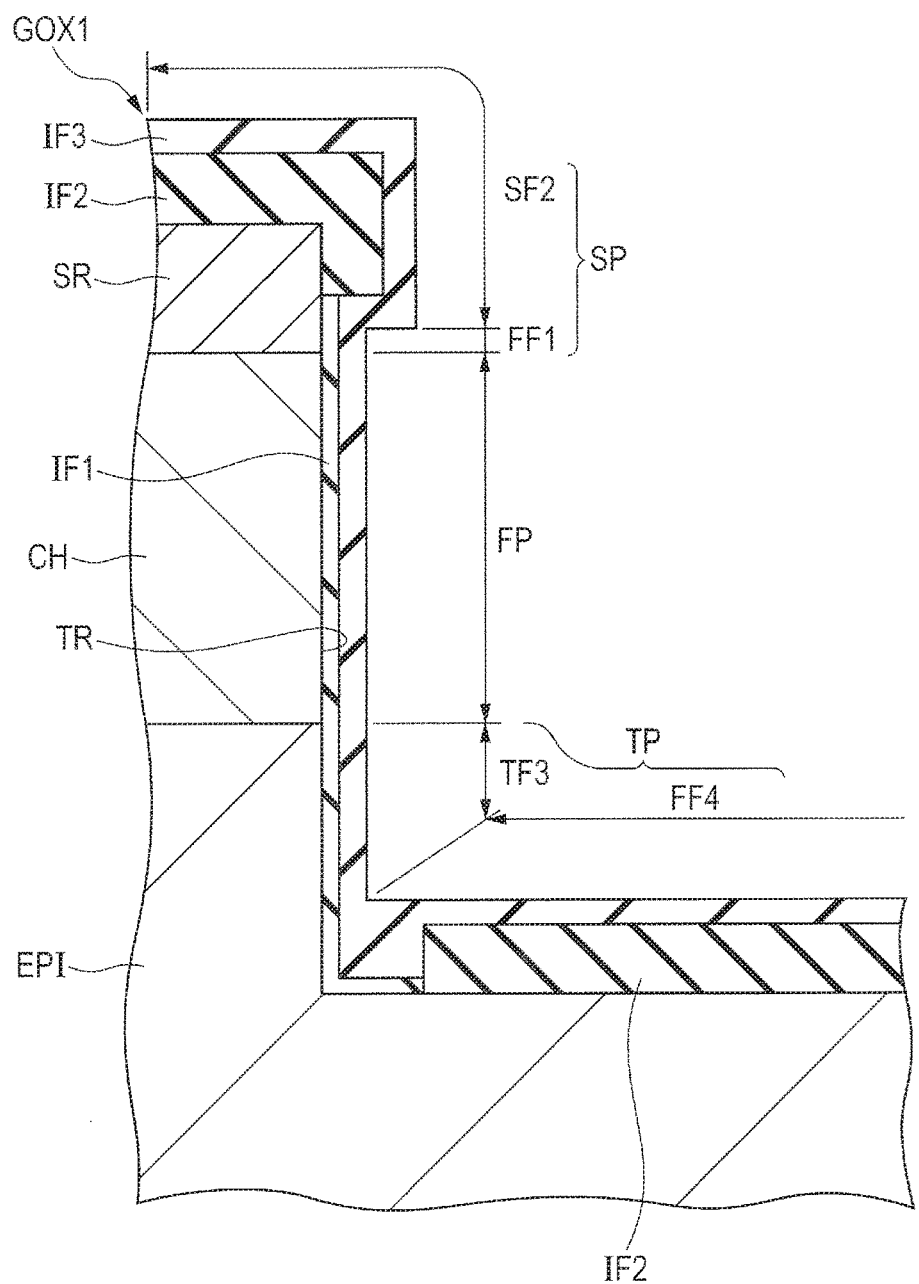
FIG. 4 is an enlarged diagram schematically illustrating one example of a detailed configuration of a gate insulating film which is formed over a range from an inner wall of a trench to a part of an upper surface of a source region.

Then, a detailed configuration of the gate insulating film GOX1 according to the present embodiment will be described. FIG. 4 is an enlarged diagram schematically illustrating one example of the detailed configuration of the gate insulating film GOX1 which is formed over the range from the inner wall of the trench TR to the part of the upper surface of the source region SR. In FIG. 4, the gate insulating film GOX1 according to the present embodiment includes a first part FP which is in contact with the channel layer CH, a second part SP which is contiguous to the first part FP and is in contact with the source region SR and a third part TP which is contiguous to the first part FP and is in contact with the drift layer EPI.

Then, the second part SP includes a first film-thickness part FF1 which is contiguous to the first part FP and a second film-thickness part SF2 which is contiguous to the first film-thickness part FF1, is made thicker than the first film-thickness part FF1 and covers the corner part of the trench TR which is in contact with the source region SR.

On the other hand, the third part TP includes a third film-thickness part TF3 which is contiguous to the first part FP and a fourth film-thickness part FF4 which is contiguous to the third film-thickness part TF3, is made thicker than the third film-thickness part TF3 and is formed on/over the bottom of the trench TR.

Here, the first part FP of the gate insulating film GOX1 is configured by an insulating film IF1 which is in contact with the channel layer CH and an insulating film IF3 which is formed on/over the insulating film IF1 and is made thicker than the insulating film IF1 in film thickness. On the other hand, the first film-thickness part FF1 which configures the second part SP of the gate insulating film GOX1 is configured by the insulating film IF1 and the insulating film IF3 and the second film-thickness part SF2 which configures the second part SP of the gate insulating film GOX1 is configured by an insulating film IF2 which is made thicker than the insulating film IF3 in film thickness and the insulating film IF3 which is formed on/over the insulating film IF2.

In addition, the third film-thickness part TF3 which configures the third part TP of the gate insulating film GOX1 is configured by the insulating film IF1 and the insulating film IF3, and the fourth film-thickness part FF4 includes a part which is configured by the insulating film IF2 and the insulating film IF3. In this case, each of the insulating films IF1 to IF3 is, for example, a silicon oxide film. Then, for example, the insulating film IF1 is formed on/over exposed regions of the drift layer EPI and the channel layer CH which are made of SiC by using the thermal oxidation method and therefore carbon is contained in the insulating film IF1 as described later.

According to the gate insulating film GOX1 so configured as mentioned above in the present embodiment, the configuration that the film thickness of the part of the gate insulating film GOX1 which covers the corner part of the trench TR which is in contact with the source region SR and the film thickness of the part of the gate insulating film GOX1 which covers the corner part of the trench TR which is in contact with the drift layer EPI are respectively made thicker than the film thickness of the part of the gate insulating film GOX1 which is in contact with the channel layer CH is realized. Thereby, according to the present embodiment, it is possible to prevent the gate insulating film GOX1 from being broken on the corner parts of the trench TR where the electric field concentration is liable to occur and thereby it is possible to improve the reliability of the semiconductor device.

<Manufacturing Method of the Semiconductor Device According to the Present Embodiment>

The trench gate type unit transistor according to the present embodiment is configured as described above. In the following, a manufacturing method thereof will be described with reference to the drawings.

Figure 5:
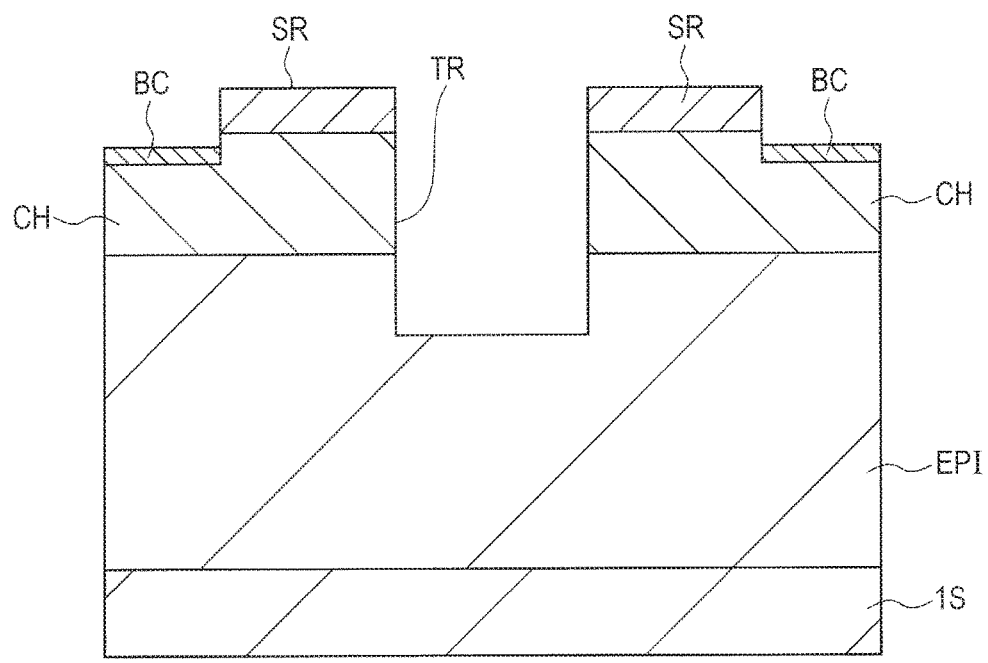
FIG. 5 is a sectional diagram illustrating one example of a manufacturing process for a semiconductor device according to one embodiment.

First, as illustrated in FIG. 5, the semiconductor substrate 1S on/over which the drift layer EPI which is the n-type semiconductor layer has been formed and is made of SiC is prepared. Then, for example, the channel layer CH which is the p-type semiconductor layer is formed on/over the drift layer EPI by using, for example, a photolithography technology and an ion implantation method. Thereafter, the source region SR which is the n-type semiconductor region is formed on/over the surface of the channel layer CH by using, for example, the photolithography technology and the ion implantation method.

Then, the trench TR which passes through the source region SR and the channel layer CH and reaches the drift layer EPI is formed by using, for example, the photolithography technology and an etching technology. Further, the groove which passes through the source region SR and reaches the channel layer CH is formed by using, for example, the photolithography technology and the etching technology, and the body contact region BC which is the p-type semiconductor region which is higher in impurity concentration than the p-type semiconductor layer of the channel layer CH is formed on/over the bottom of the groove by using, for example, the photolithography technology and the ion implantation method.

Figure 6:
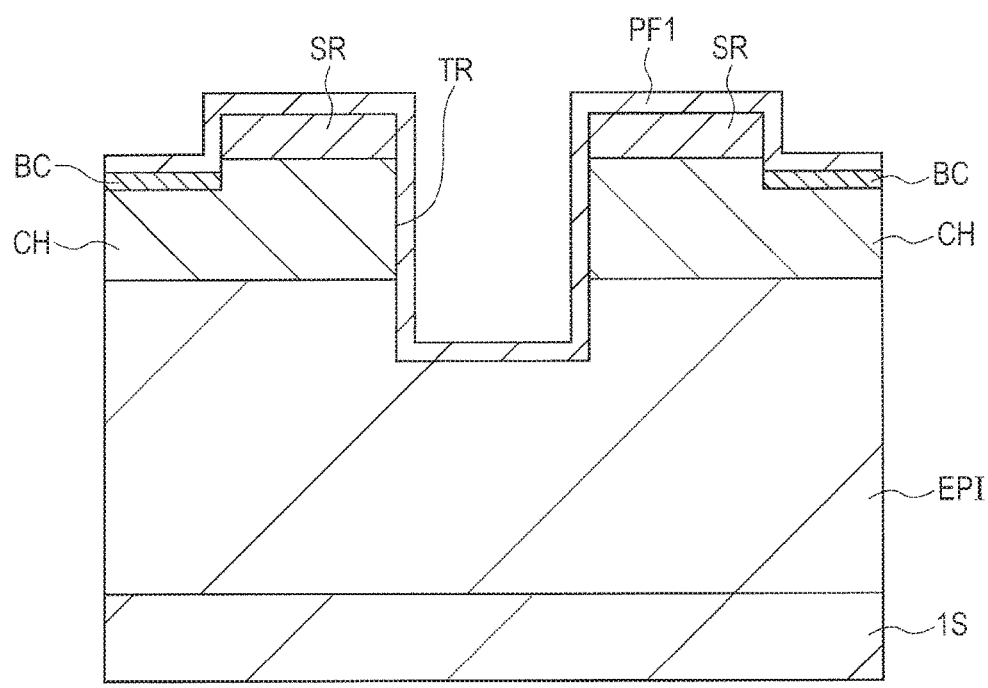
FIG. 6 is a sectional diagram illustrating the manufacturing process for the semiconductor device following the process in FIG. 5.

Next, as illustrated in FIG. 6, a polysilicon film PF1 is formed on/over a region including the inner wall of the trench TR and the upper surface of the source region SR. The polysilicon film PF1 may be formed by using, for example, a CVD (Chemical Vapor Deposition) method.

Figure 7:
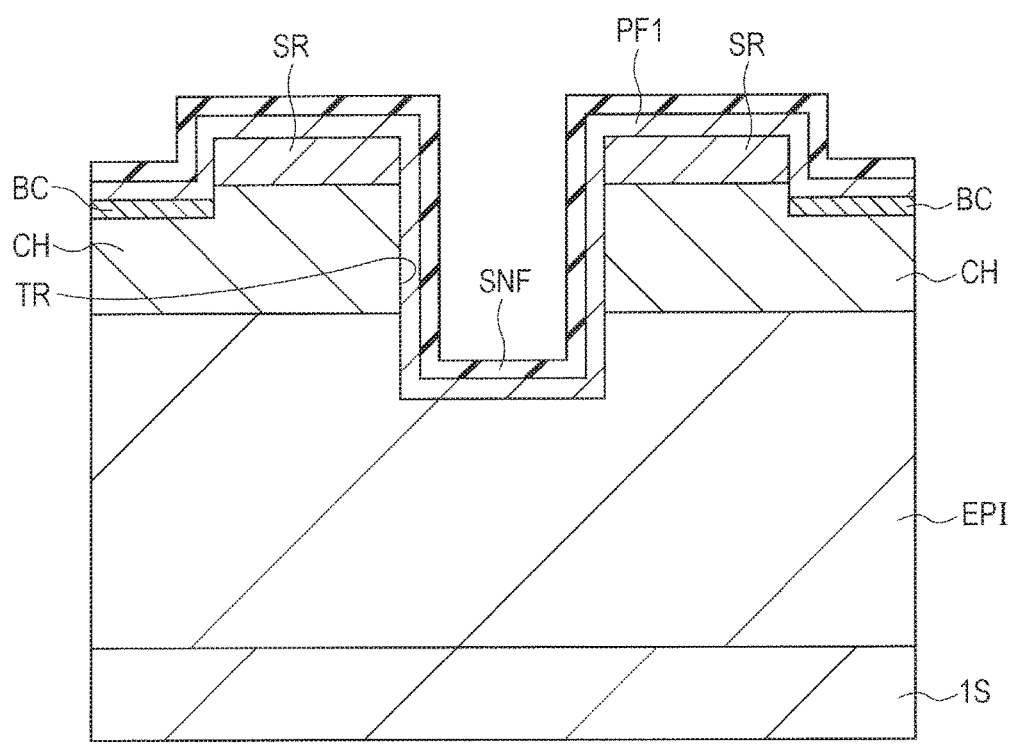
FIG. 7 is a sectional diagram illustrating the manufacturing process for the semiconductor device following the process in FIG. 6.
Figure 8:
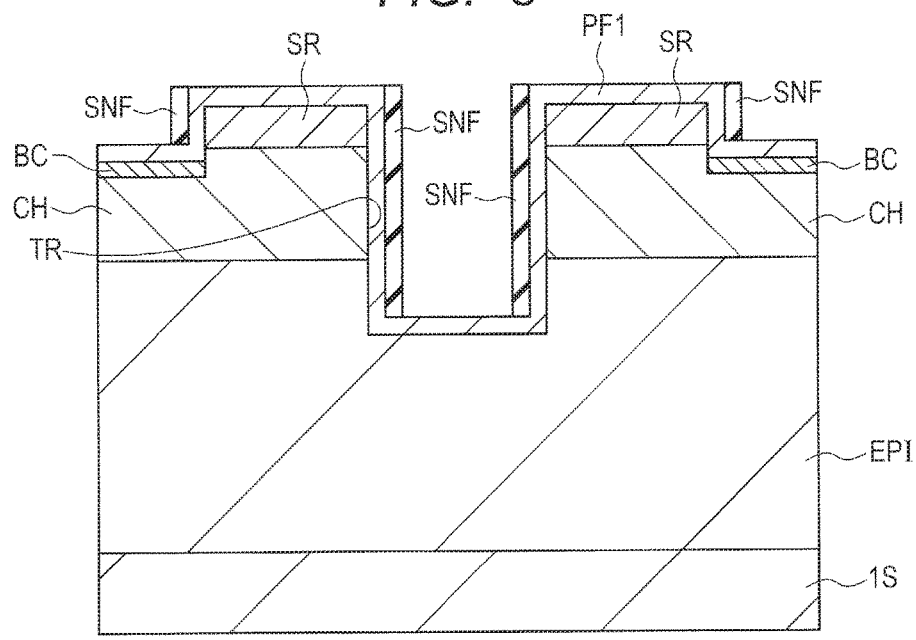
FIG. 8 is a sectional diagram illustrating the manufacturing process for the semiconductor device following the process in FIG. 7.

Thereafter, as illustrated in FIG. 7, a silicon nitride film SNF is formed on/over the polysilicon film PF1. The silicon nitride film SNF may be formed by using, for example, the CVD method. Then, as illustrated in FIG. 8, anisotropic etching is performed on the silicon nitride film SNF. Thereby, for example, the silicon nitride film SNF is left only on a side wall of the trench TR and a side wall of the groove. In other words, the silicon nitride film SNF which is formed on other regions is removed and the polysilicon film PF1 is exposed.

Figure 9:
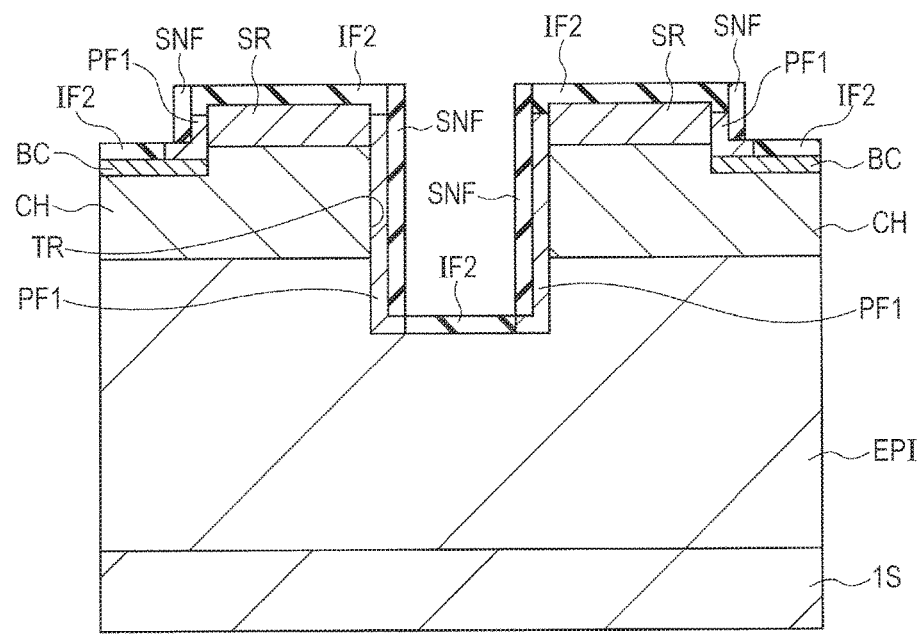
FIG. 9 is a sectional diagram illustrating the manufacturing process for the semiconductor device following the process in FIG. 8.

Then, as illustrated in FIG. 9, the exposed polysilicon film PF1 is oxidized by using, for example, the thermal oxidation method to form the insulating film IF2 which is configured by the silicon oxide film. At this time, the polysilicon film PF1 which is covered with the oxidation-resistant silicon nitride film SNF is not oxidized.

Figure 10:
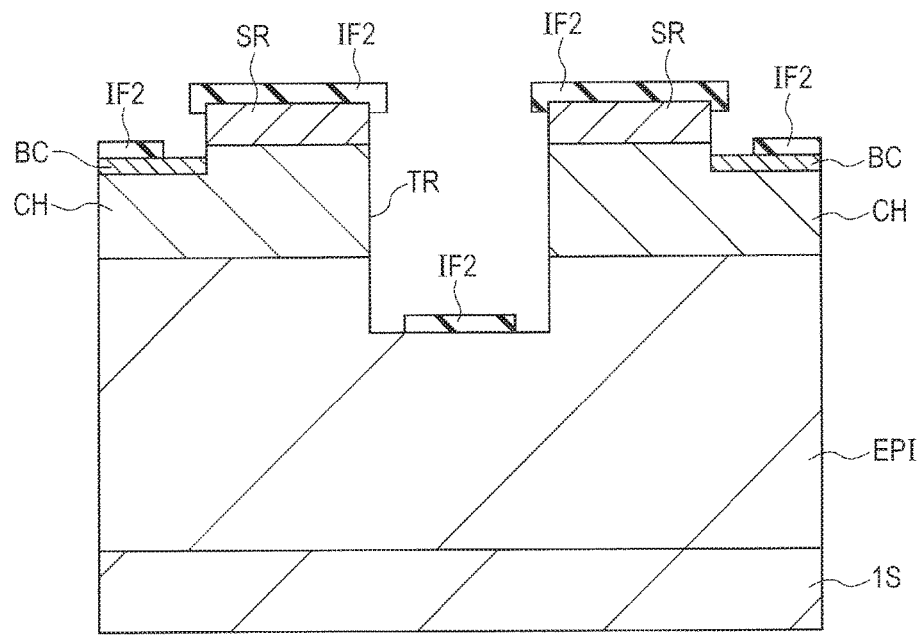
FIG. 10 is a sectional diagram illustrating the manufacturing process for the semiconductor device following the process in FIG. 9.

Then, as illustrated in FIG. 10, the silicon nitride film SNF is removed and then the exposed polysilicon film PF1 is removed by using, for example, a wet etching technology using hot phosphoric acid. Consequently, the insulating film IF2 is left as illustrated in FIG. 10.

Figure 11:
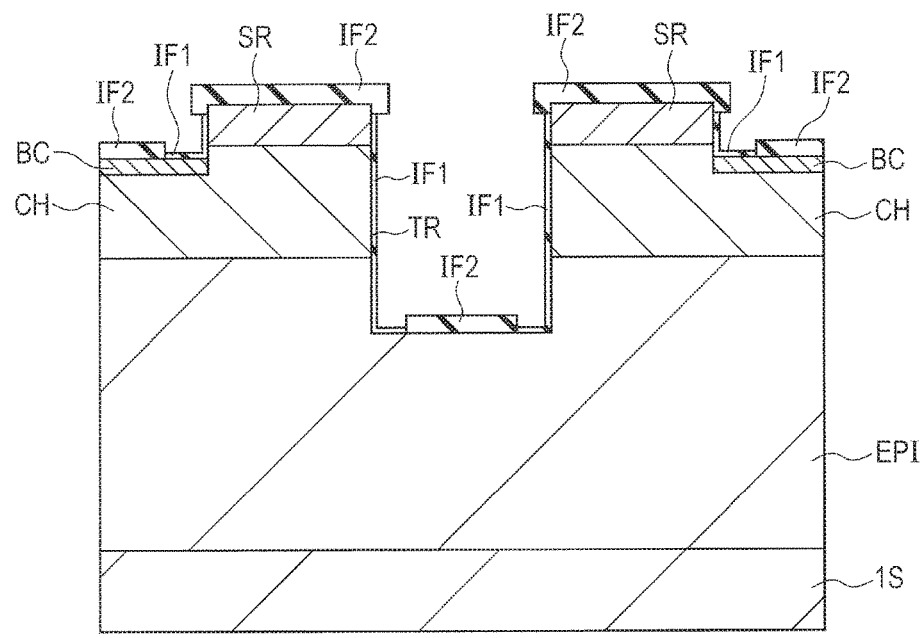
FIG. 11 is a sectional diagram illustrating the manufacturing process for the semiconductor device following the process in FIG. 10.

Then, as illustrated in FIG. 11, the insulating film IF1 which is configured by the silicon oxide film is formed on/over the inner wall of the trench TR which is exposed from the insulating film IF2 by using, for example, the thermal oxidation method. At this time, carbon is contained in the insulating film IF1 which is formed by performing the thermal oxidation method on the exposed surfaces of the drift layer EPI and the channel layer CH which are made of SiC. The film thickness of the insulating film IF1 is thinner than the film thickness of the insulating film IF2.

Figure 12:
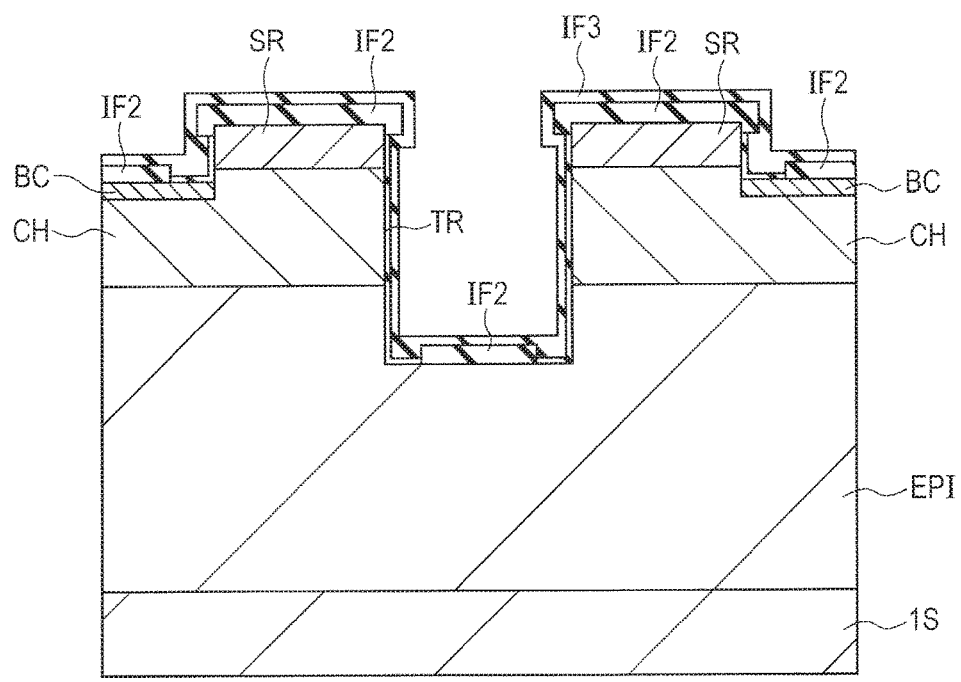
FIG. 12 is a sectional diagram illustrating the manufacturing process for the semiconductor device following the process in FIG. 11.

Next, as illustrated in FIG. 12, the insulating film IF3 which is configured by the silicon oxide film is formed so as to cover the insulating film IF1 which has been formed on/over the inner wall of the trench TR, the insulating film IF2 which has been formed on/over the inner wall of the trench TR and the insulating film IF2 which has been formed on/over the upper face of the source region SR. The insulating film IF3 is formed by using, for example, the CVD method. At this time, for example, the film thickness of the insulating film IF3 is made thicker than the film thickness of the insulating film IF1 and is made thinner than the film thickness of the insulating film IF2. Formation of the gate insulating film GOX1 having the parts which are different from one another in film thickness which is the characteristic point of the present embodiment is made possible by performing the above-mentioned processes. The configuration that, in particular, the film thickness of the part of the gate insulating film GOX1 which covers the corner part of the trench TR which is in contact with the source region SR and the film thickness of the part of the gate insulating film GOX1 which covers the corner part of the trench TR which is in contact with the drift layer EPI are made thicker than the film thickness of the part of the gate insulating film GOX1 which is in contact with the channel layer CH is realized.

Figure 13:
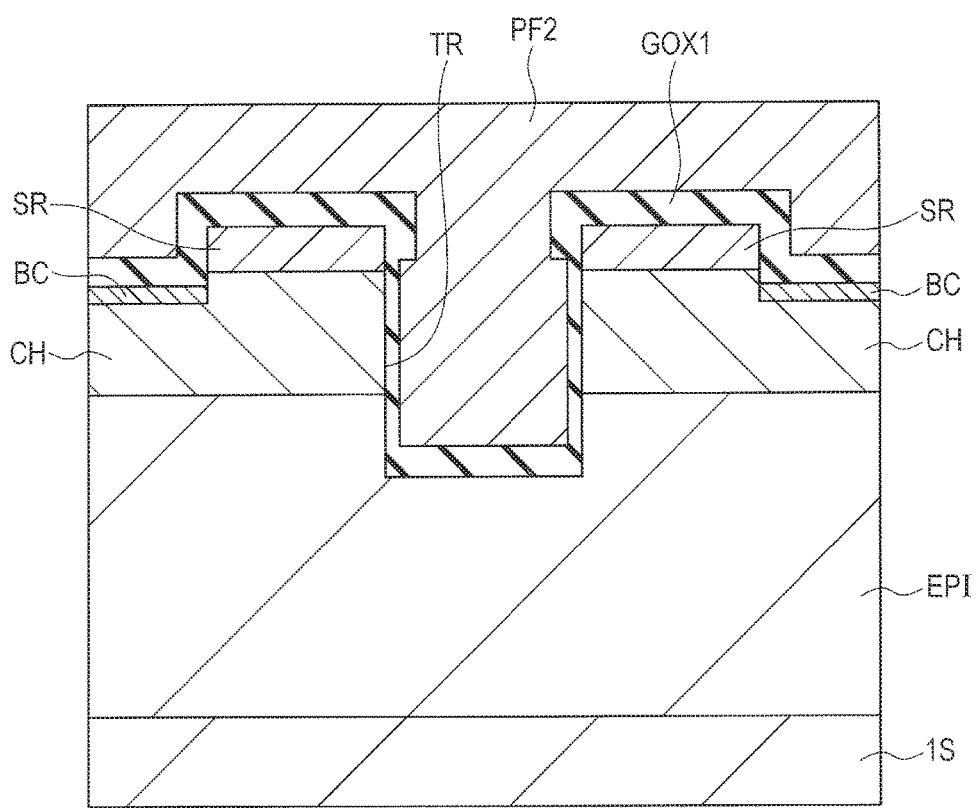
FIG. 13 is a sectional diagram illustrating the manufacturing process for the semiconductor device following the process in FIG. 12.
Figure 14:
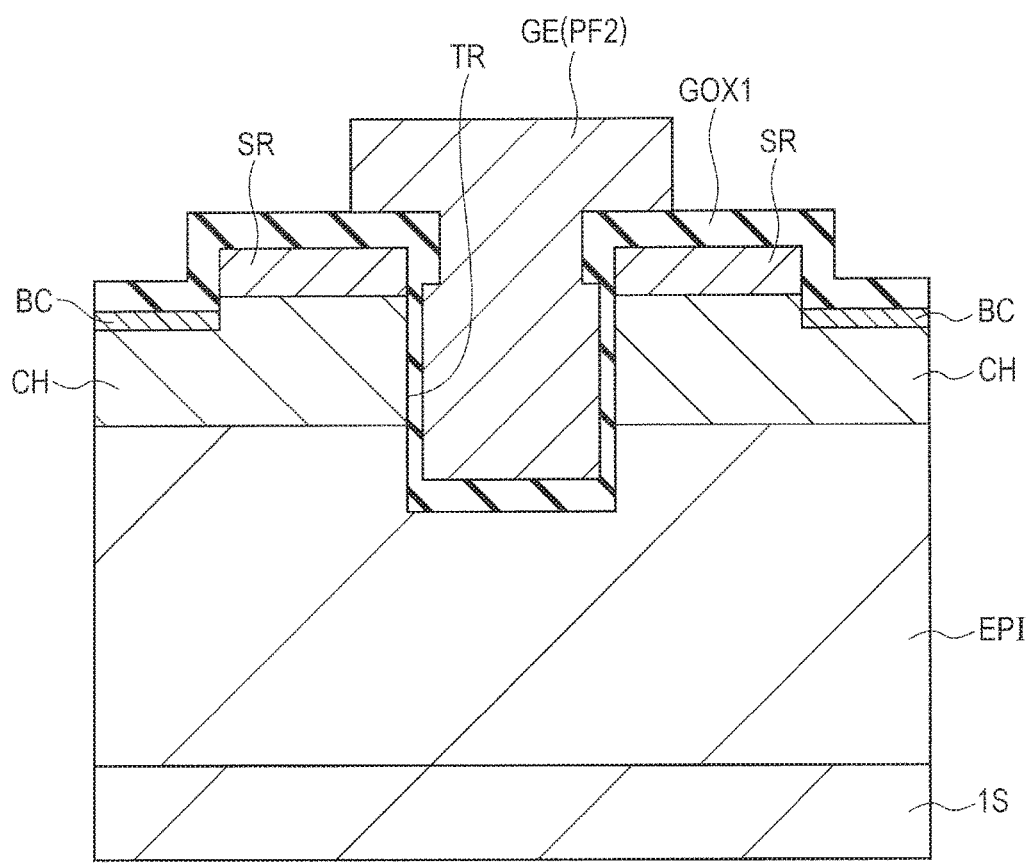
FIG. 14 is a sectional diagram illustrating the manufacturing process for the semiconductor device following the process in FIG. 13.

Then, as illustrated in FIG. 13, a polysilicon film PF2 which fills the inside of the trench TR and covers the gate insulating film GOX1 is formed by using, for example, the CVD method. Then, as illustrated in FIG. 14, patterning is performed on the polysilicon film PF2 by using, for example, the photolithography technology and the etching technology. Thereby, it is possible to form the gate electrode GE which is configured by the polysilicon film PF2. In particular, in the present embodiment, the gate electrode GE having the "T-gate structure" is formed.

Then, as illustrated in FIG. 3, the interlayer insulating film IL is formed so as to cover the gate electrode GE. The interlayer insulating film IL is configured by, for example, the silicon oxide film. Then, patterning is performed on the interlayer insulating film IL by using, for example, the photolithography technology and the etching technology thereby to form an opening. The interlayer insulating film IL is formed in order to separate the gate electrode GE from the later described source electrode (SE).

Next, a barrier conductor film (not illustrated) (for example, a TiN film) is formed on/over the surface of the interlayer insulating film IL with the opening being formed and a metal film is formed on/over the barrier conductor film by using, for example, a sputtering method. The metal film may be configured by, for example, an aluminum film, an aluminum alloy film (an AlSi film and so forth) and so forth. Then, patterning is performed on the metal film and the barrier conductor film by using, for example, the photolithography technology and the etching technology. Consequently, it is possible to form, for example, the source electrode SE (a source pad) and a gate pad. It is possible to manufacture the semiconductor device according to the present embodiment in the above-mentioned way.

<Altered Example>

Figure 15:
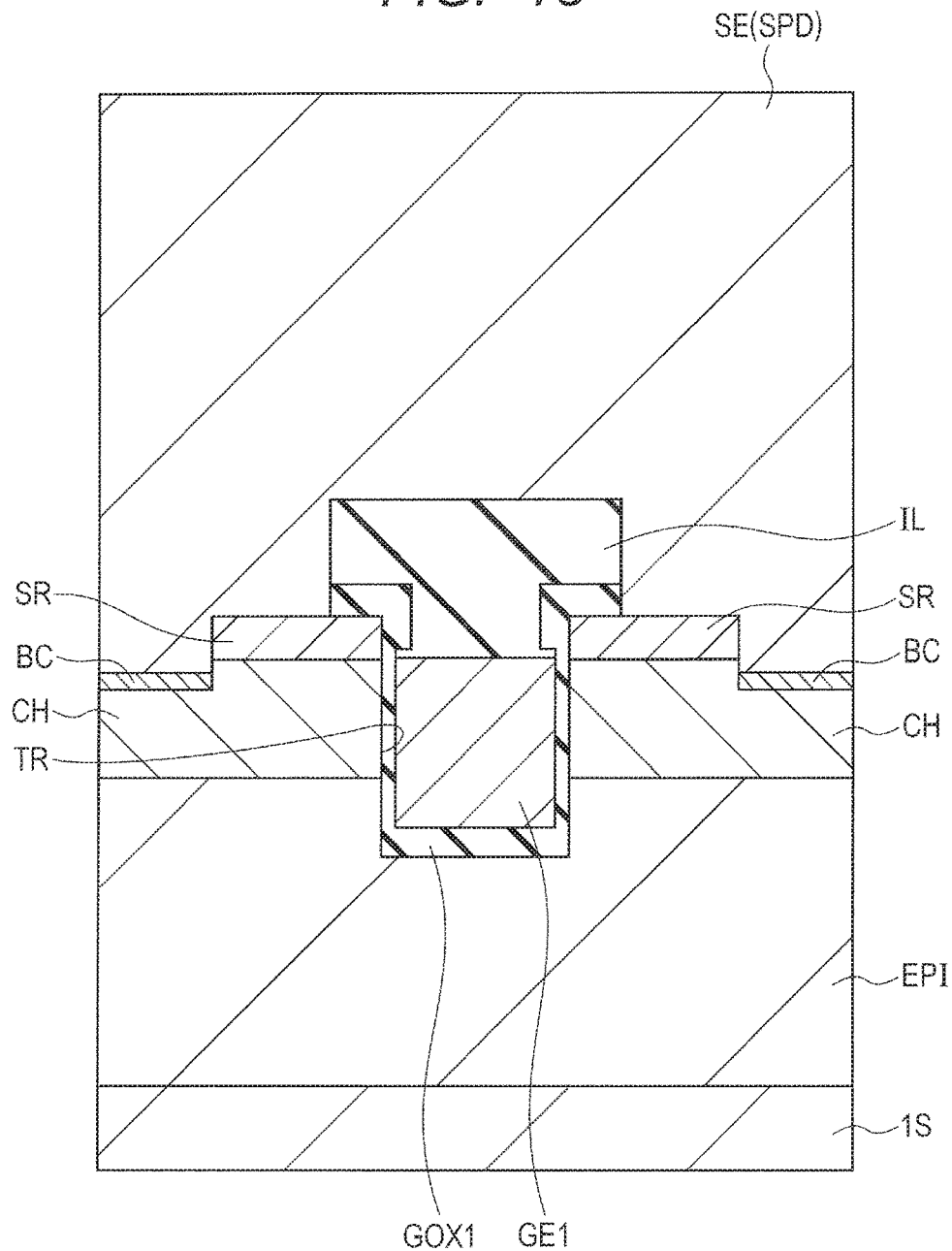
FIG. 15 is a sectional diagram illustrating on example of a sectional configuration of a trench gate type unit transistor according to an altered example.

Then, the altered example of the present embodiment will be described. FIG. 15 is a sectional diagram illustrating one example of a sectional configuration of a trench gate type unit transistor according to the altered example. In the altered example illustrated in FIG. 15, a gate electrode GE1 is formed only in the trench TR. That is, in the altered example, the unit transistor has a so-called "recessed gate structure" that the upper surface of the gate electrode GE1 is located lower than the upper surface of the source region SR. Also in this altered example, it is possible to adopt the characteristic point of the above-mentioned embodiment that the film thickness of the part of the gate insulating film GOX1 which covers the corner part of the trench TR which is in contact with the source region SR and the film thickness of the part of the gate insulating film GOX1 which covers the corner part of the trench TR which is in contact with the drift layer EPI are respectively made thicker than the film thickness of the part of the gate insulating film GOX1 which is in contact with the channel layer CH.

In regard to this point, since in the T-gate structure which is adopted in the above-mentioned embodiment, the electric field concentration is liable to occur not only on the part of the gate insulating film GOX1 which covers the corner part of the trench TR which is in contact with the drift layer EPI but also on the part of the gate insulating film GOX1 which covers the corner part of the trench TR which is in contact with the source region SR, the configuration which adopts the characteristic point of the above-mentioned embodiment is useful.

Whereas, in the "recessed gate structure" of the altered example, although the electric field concentration does not occur on the part of the gate insulating film GOX1 which covers the corner part of the trench TR which is in contact with the source region SR, the electric field concentration still occurs on the part of the gate insulating film GOX1 which covers the corner part of the trench TR which is in contact with the drift layer EPI. Accordingly, it is useful to adopt the technical idea (the characteristic configuration) of the above-mentioned embodiment in the "recessed gate structure" of the altered example. Accordingly, it is also possible to improve the reliability of the semiconductor device also in the altered example by adopting the technical idea (the characteristic configuration) of the above-mentioned embodiment.

Incidentally, as the advantage of adopting the "recessed gate structure" of the altered example, since the gate electrode GE1 does not have the part which is protruded from the trench TR, it is possible to improve the degree of integration of the unit transistor. Consequently, according to the "recessed gate structure" of the altered example, it is possible to obtain such an advantage that it is possible to more reduce the on-resistance of the power transistor.

Although the invention which has been made by the inventors and others has been specifically described on the basis of the embodiment thereof as mentioned above, it goes without saying that the present invention is not limited to the above-mentioned embodiment and may be altered and modified in a variety of ways within a range not deviating from the gist of the present invention.

Although the invention which has been made by the inventors and others has been specifically described on the basis of the embodiment thereof as mentioned above, it goes without saying that the present invention is not limited to the above-mentioned embodiment and may be altered and modified in a variety of ways within a range not deviating from the gist of the present invention.

What is claimed is:

1. A semiconductor device manufacturing method comprising the steps of:
   (a): preparing a semiconductor substrate over which a drift layer is formed;
   (b) forming a channel layer over the drift layer;

(c) forming a source region over a surface of the channel layer;

(d) forming a trench which passes through the source region and the channel layer and reaches the drift layer;

(e) forming a conductor film over a region from an inner wall of the trench to the source region;

(f) forming an insulating film over the conductor film;

(g) performing anisotropic etching on the insulating film;

(h) after the step (g), oxidizing the conductor film which is exposed from the insulating film and thereby forming a second insulating film;

(i) after the step (h), removing the insulating film;

(j) after the step (i), removing the conductor film which is not yet oxidized;

(k) after the step (j), forming a first insulating film over the exposed inner wall of the trench;

(l) after the step (k), forming a third insulating film over a region from the first insulating film to the second insulating film;

(m) after the step (l), forming a gate insulating film which includes the first insulating film, the second insulating film and the third insulating film by performing patterning on the third insulating film; and (n) after the step (m), forming a gate electrode which is in contact with the gate insulating film.

2. The semiconductor device manufacturing method according to claim 1,
wherein the semiconductor substrate contains SiC;
wherein the conductor film is a polysilicon film;
wherein the insulating film is a silicon nitride film;
wherein the first insulating film is a silicon oxide film;
wherein the second insulating film is a silicon oxide film; and
wherein the third insulating film is a silicon oxide film.

3. The semiconductor device manufacturing method according to claim 2,
wherein the second insulating film is formed by a thermal oxidation method, and
wherein the third insulating film is formed by a CVD method.

4. The semiconductor device manufacturing method according to claim 1,
Wherein, in the first insulating film, the second insulating film and the third insulating film,
the film thickness of the first insulating film is the thinnest.

* * * * *